United States Patent
Zheng

(10) Patent No.: US 6,232,834 B1
(45) Date of Patent: May 15, 2001

(54) CALIBRATED COMPENSATION FOR AN OPERATIONAL AMPLIFIER

(75) Inventor: Zhiliang Zheng, San Jose, CA (US)

(73) Assignee: Marvell International Ltd. (BM)

( * ) Notice: Subject to any disclaimer, the term of this patent is extended or adjusted under 35 U.S.C. 154(b) by 0 days.

(21) Appl. No.: 09/501,557

(22) Filed: Feb. 9, 2000

(51) Int. Cl.[7] .............................. H03F 1/36; G01R 19/00
(52) U.S. Cl. ............................ 330/107; 330/2; 330/86; 330/109
(58) Field of Search .................... 330/2, 86, 107, 330/109, 292, 294

(56) References Cited

U.S. PATENT DOCUMENTS

| | | | |
|---|---|---|---|
| 3,818,336 | * 6/1974 | Marshall | 330/10 |
| 4,164,715 | * 8/1979 | Thurmond | 330/107 |
| 4,481,466 | * 11/1984 | Roos et al. | 330/107 |
| 4,777,430 | * 10/1988 | Schabaner | 330/79 |
| 4,868,516 | * 9/1989 | Henderson et al. | 330/86 |
| 5,117,200 | 5/1992 | Scott, III | 330/253 |
| 5,642,078 | 6/1997 | Navabi et al. | 330/253 |

* cited by examiner

Primary Examiner—Robert Pascal
Assistant Examiner—Patricia T. Nguyen
(74) Attorney, Agent, or Firm—George O. Saile; Stephen B. Ackerman; Eric Janofsky

(57) ABSTRACT

In this invention an integrated operational amplifier is calibrated to optimize phase margin. The calibration is done to correct changes caused by operating temp and supply voltages as well as process variations and aging that can affect the stability of the amplifier. A calibration circuit measures the response of the operational amplifier to a pulse input and controls a feedback impedance to produce an optimized phase margin. The output response to the pulse input is measured at two different times, at a first time close to the transition capturing the peak overshoot from an under damped amplifier and at second time later than the first measurement when the distortions from the under damped ringing have diminished. A quantizer circuit compares the two measure voltages and provides an input to control logic which selects the amount of reactance in the feedback of the operational amplifier. The calibration terminates when the dampening of the amplifier has reached the least significant bit of adjustment available to the calibration process.

34 Claims, 3 Drawing Sheets

CALIBRATED COMPENSATION FOR AN OPERATIONAL AMPLIFIER

BACKGROUND OF THE INVENTION

1. Field of Invention

This invention relates to integrated circuit analog amplifiers and more specifically calibrating the frequency response of operational amplifiers.

2. Description of Related Art

Operational amplifiers are found in a wide array of usages, and many of these operational amplifiers are integrated into a semiconductor chip. The ability to measure and compensate the integrated operational amplifiers are somewhat limited without using chip signal I/O and chip real estate. Process variations along with variations in temperature caused by differences in the environment in which the chips are placed can cause changes in the margin of stability of the operational amplifier. These factors along with the aging of the component parts of the operational amplifier can produce a situation which is detrimental to the stability of the amplifier by producing less phase margin or be detrimental to the operation of the amplifier by producing too much phase margin.

In U.S. Pat. No. 5,642,078 (Navabi et al.) an amplifier is disclosed that has frequency compensation using gain degeneration. The amplifier is compensated by dynamically varying the transconductance of a stage according with the gain of the output stage of the amplifier. In U.S. Pat. No. 5,117,200 (Scott, III) a wide bandwidth transconductance amplifier is stabilized over a wide range of output currents by using a compensation driver circuit to sense the output current and feed the information back through a compensation capacitor.

The stability of an amplifier can be measured by the gain margin or the phase margin of the amplifier. Where gain margin is the open loop gain required to make the amplifier unstable, and phase margin is the open loop phase shift required to make the closed loop amplifier unstable. Both these measurements of stability measurements would be difficult and laborious to make on an integrated circuit, and once made corrections would be as difficult. A way is needed to automatically make measurements on the integrated amplifier and correct for shifts in the characteristics of the amplifier that can be caused by differences in manuafacturing, changes in the environment such as temperature and aging.

SUMMARY OF THE INVENTION

In this invention a method an implementation is described for detecting the phase margin of an operational amplifier and making corrections at any time during the operational life of the amplifier. The method relies on the pulse response of the amplifier in which the output response is detected and a feedback impedance of the amplifier is modified to produce a response that is critically damped. Critically damped is defined as that characteristic of the amplifier which is the juncture between being over damped and under damped. Over damped is when there is too much phase shift in the response of the amplifier, and the amplifier takes too much time to settle out from the input pulse. Under damped is when there is too little phase shift m the amplifier resulting in less phase margin and ringing on the output response of the input pulse.

A pulse is applied to the input of the operational amplifier to be compensated, and the ringing, or the lack thereof, on the resulting output pulse is measured. Where ringing is the oscillatory condition at the end of a wave form transition which initially overshoots the end of the transition with a decaying like oscillation to a steady state value after a period of time. A feedback impedance to the operational amplifier is changed to decrease the tendency to ring by increasing the phase margin in an under damped condition, or increase the tendency to ring by decreasing the phase margin in the over damped condition.

In the preferred implementation of this invention a plurality of capacitors are connected in parallel by a plurality of switches. each capacitor being associated with one switch. The parallel combination of capacitors and their switches are connected in series with a resistor in a feedback loop on an operational amplifier. The capacitors are selected by control logic which is set to select more capacitance or less capacitance depending on the amount of dampening that exist on an output pules resulting from a pulse being applied to the input of the amplifier. A peak detector detect the overshot, or lack of overshoot, at a time t1 which is close to the end of the pulse transition on the output. A voltage detector samples and holds the value of the pulse at a time, t2, which is later than t1. A quantizer circuit produces a digital signal, a one or a zero, depending upon whether the peak detector at t1 reads a higher or lower voltage than the sample and hold voltage at t2. The digital signal from the quantizer circuit is fed to the control logic which then selects more capacitance if the peak voltage at t1 is higher than the sample and hold voltage at t2, or selects less capacitance if the peak voltage at t1 is less than the sample and hold voltage at t2.

Whereas the preferred implementation of this invention uses switches to select or deselect capacitance in the feedback of an operational amplifier to compensate the amplifier, other means such as using a variable capacitor driven from a digital to analog converter connected to the control logic could be used. The amplifier does not have to be wholly or partially integrated for this invention to be applicable. Any form of impedance in the feedback of the amplifier can be used where the reactive part of the impedance can be varied and controlled by the control logic. The control logic is also not necessary as long as some form of holding or latching the final value selecting the variable reactive part of the feedback impedance is used to maintain the value of the impedance until the next calibration.

BRIEF DESCRIPTION OF THE DRAWINGS

This invention will be described with reference to the accompanying drawings, wherein.

DETAILED DESCRIPTION OF THE PREFERRED EMBODIMENT

Figure 1A:
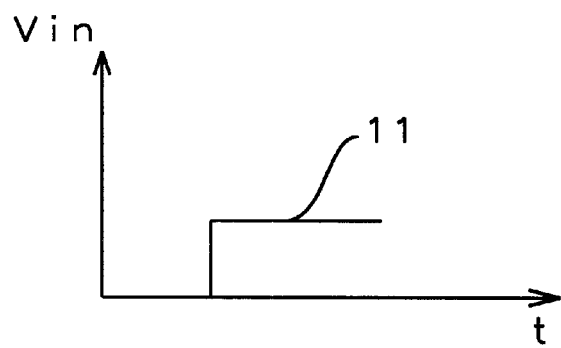
FIGS. 1a, 1b and 1c show an overview of an output pulse response of an amplifier to an input pulse.
Figure 1B:
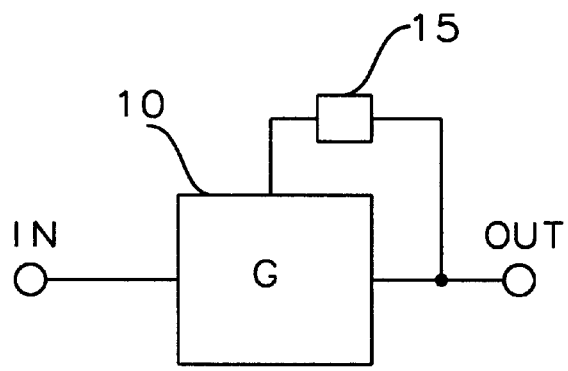
Figure 1C:
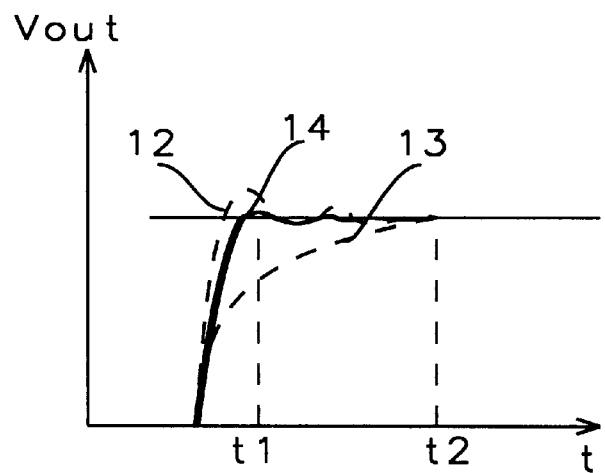

In FIGS. 1a, 1b and 1c is shown an amplifier 10 having a gain G. Applied to the input to the amplifier 10 is a pulse Vin 11, and the response Vout ofthe amplifier to Vin 11 may be one of several responses, an under damped response 12 to the input pulse 11, an over damped response 13 to the input pulse 11, or a critically damped response 14 to the input pulse 11. A peak value at time t1 is used along with a voltage sampled and held at time t2 to control the amplifier through a calibration circuit 15 to produce a critically damped output response 14 of the amplifier 10 to the input pulse 11. The time of the peak occurrence, t1, changes as the measured voltage moves between being over damped to under damped; therefore, a peak detector is used to capture the peak voltage at t1. The measurement at t2 is delayed enough in time beyond t1 to allow the under damped distortions of the output wave form 12 to have diminished to a minimal effect. The setting for the critically damped response 14 is maintained until the next calibration of the amplifier. At the next calibration measurement the setting may need changing because of environmental condition such as temperature and voltage as well as any aging of the elements that make up the integrated circuit including the calibration circuit.

Figure 2:
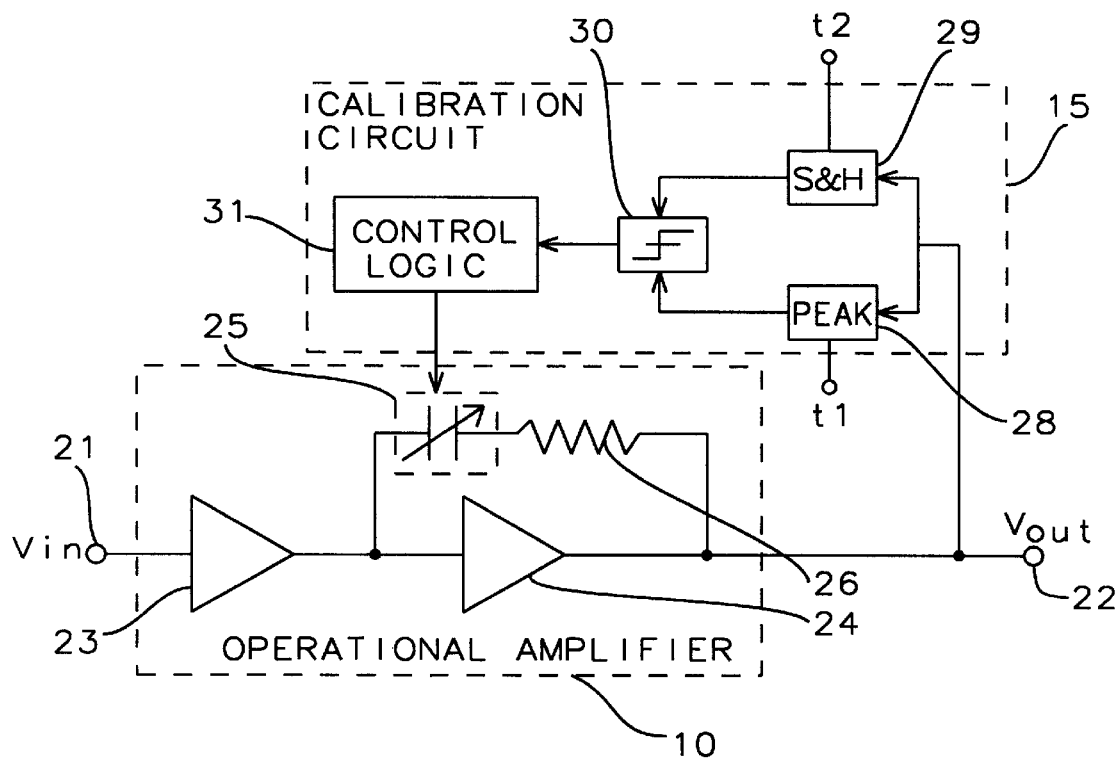
FIG. 2 is a block diagram of the preferred implementation of this invention.

In FIG. 2 is shown the preferred embodiment of this invention. An operational amplifier 10 has an input 21 and an output 22. The input pulse 11 is applied to the input 21 and a response 12 13 14 results on the output 22 during calibration. The operational amplifier comprises a buffer amplifier 23 and an output amplifier 24. The output amplifier 24 has a variable impedance in its feedback comprising a resistance 26 and a variable capacitance 25. The output 22 of the operational amplifier 10 is connected to a calibration circuit 15 which controls the variable capacitance 25. A peak detector 28 measures the peak voltage at t1 and a sample and hold (S&H) 29 measures the voltage at t2 of the output response 12 13 14 of the operational amplifier 10 to an input pulse 11. The output of the peak detector 28 and the sample and hold 29 are fed to a quantizer 30 that produces a logic signal, one or zero, depending upon whether the peak voltage at t1 is larger or smaller than the voltage at t2 measured by the sample and hold circuit 29. The output of the quantizer circuit 30 is used by the control logic to increase the capacitance of the variable capacitor 25 when the output response is under damped 12, or to decrease the capacitance of the variable capacitor 25 when the output response is over damped 13.

At the beginning of calibration, the operational amplifier 10 is started in an over damped condition. The variable capacitance 25 is adjusted which moves the voltage at the output 22 of the operational amplifier 10 from being over damped to critically damped. When the magnitude of the difference between the output voltage 22 measured by the peak detector 28 and the sample and hold 29 becomes the smallest difference, the calibration of the operational amplifier is finishes, and the value of the capacitance of capacitor 25 establishing the calibration is used until the next calibration that determines a different value of capacitance is required.

Figure 3:
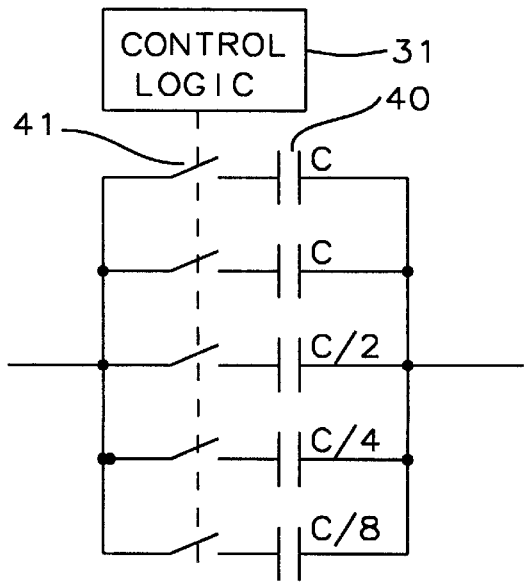
FIG. 3 is a schematic diagram of the variable capacitance and associated selection switches.

In FIG. 3 is shown the variable capacitor 25. There are a number of capacitors 40 each in series with a switch 41. The value of the capacitors range from C to C/8 and are connected in parallel by means of the switches 41 controlled by the control logic 31. The values of the capacitors are by no means the only ones that could be selected and the number of capacitors is not limited to the number that is shown The value and quantity of capacitors 40 is dependent upon the particulars of the design of the amplifier 10 and the resolution of the calibration circuitry 15. It should also be pointed out that the variable capacitor 25 shown in FIG. 3 is only one implementation of a variable capacitance. Other implementations such as having as few as one voltage variable capacitor controlled from the control logic could be used.

Figure 4:
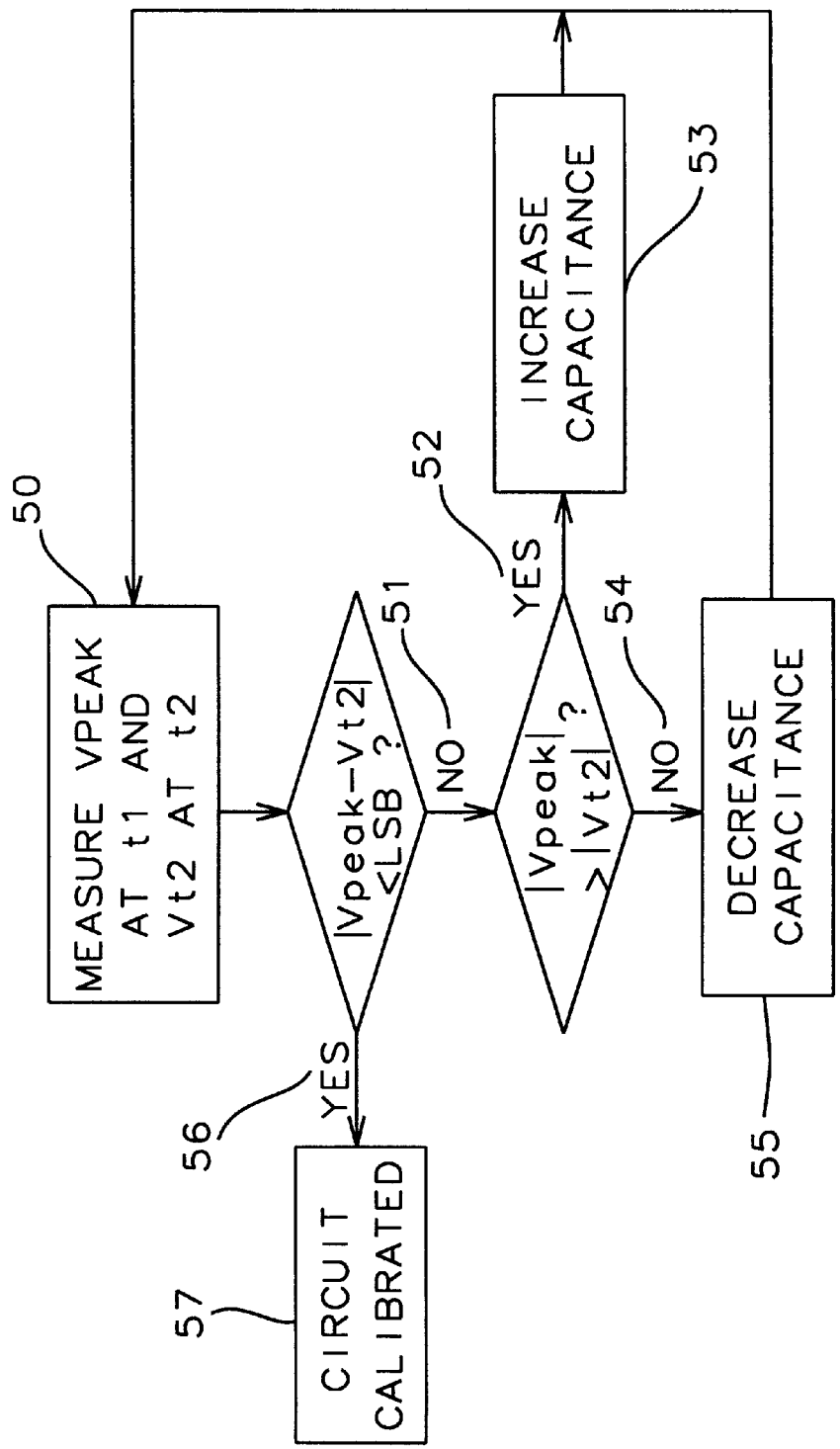
FIG. 4 is a flow diagram of the process of the preferred implementation for calibration of the operational amplifier for dampening.

In FIG. 4 is shown the process for calibrating the operational amplifier 10 using the calibration circuit 15 to control the variable feedback capacitance 25. The output response 12 13 14 of the operational amplifier 10 is measured 50 at t1 for peak voltage and at t2 for sample and hold voltage. If |Vpeak−Vt2|>LSB 51 and if |Vpeak|>|Vt2|52, then the capacitance of the variable capacitor 25 is increased 53, where LSB is the resolution of the calibration circuit 15 and the variable feedback capacitance 25 , Vpeak is the voltage measured by the peak detector 28 at time t1, and Vt2 is the voltage measured by the sample and hold circuit 29 at time t2. If |Vpeak−Vt2|>LSB 51 and if |Vpeak|<|Vt2|54, then the capacitance of the variable capacitor is decreased 55. If |Vpeak−Vt2|<LSB the circuit is calibrated 57 and the process ends.

The calibration process begins with the operational amplifier 10 in an over damped condition 13 where |Vpeak|<|Vt2|54 and the amount of capacitance needs to be decreased 55. The amount of capacitance is decreased 55 until the output voltage of the operational amplifier becomes critically damped |Vpeak−Vt2|<LSB 56 and the calibration process ends 57. If the adjustment of the capacitance of the capacitor 25 pushes the operational amplifier 10 beyond critically damped condition to an underdamped condition Vpeak >Vt2 52, then the capacitance is increased 53 until a critically damped condition |Vpeak−Vt2|<LSB 56 exists and the calibration process is completed 57.

While the invention has been particularly shown and described with reference to preferred embodiments thereof, it will be understood by those skilled in the art that various changes in form and details may be made without departing from the spirit and scope of the invention.

What is claimed is:

1. An amplifier compensated for frequency response, comprising:
   a) an operational amplifier with a variable feedback impedance,
   b) said feedback impedance comprises a fixed real part and a variable reactive part,
   c) output of said operational amplifier connected to a calibration circuit,
   d) said calibration circuit measures an output response of said operational amplifier to an input pulse during calibration and sets control logic to adjust said reactive part of said feedback impedance to optimize phase margin of said operational amplifier,
      wherein, said control logic is set during calibration by a comparison of a peak value of said output response and a later value of said output response taken after said peak value where said feedback impedance is adjusted until said peak value and said later value are within a minimum adjustment resolution of each other.

2. The amplifier of claim 1 wherein, during calibration said output response of said operational amplifier to said input pulse is detected and fed back to control said reactive part of said feedback impedance to optimize stability of said operational amplifier.

3. The amplifier of claim 1 wherein, said peak value and said later value are compared with a quantizer circuit that produces a digital signal depending whether said peak value or said later value is larger.

4. An amplifier compensated for frequency response, comprising:
   a) an operational amplifier with a variable feedback impedance,
   b) said feedback impedance comprises a fixed real part and a variable reactive part,
   c) output of said operational amplifier connected to a calibration circuit,
   d) said calibration circuit measures an output response of said operational amplifier to an input pulse during calibration and set control logic to adjust said reactive part of said feedback impedance to optimize phase margin of said operational amplifier,
      wherein said variable reactive part is a plurality of capacitors having a plurality of values and selected by a plurality of switches to connect selected capacitors in parallel.

5. The amplifier of claim 4 wherein, switches of said plural of switches are selected by said control logic during calibration.

6. The amplifier of claim 4 wherein, said variable reactive part is a voltage sensitive capacitor which is varied by a voltage controlled by said control logic and resulting from comparison of said peak value and said later value during calibration.

7. A method of calibrating an operational amplifier for an optimum phase margin, comprising:
   a) applying an input pulse to an operational amplifier during calibration,
   b) measuring peak voltage of an output response of said operational amplifier to said input pulse,
   c) measuring said output response for a second time at a time later than said peak voltage,
   d) comparing measured peak voltage to measured voltage taken at said time later than the peak voltage,
   e) producing a logic signal depending on results from comparison of said peak voltage to said voltage taken at said later time than the peak voltage,
   f) using said logic signal to set control logic to adjust amount of feedback capacitance that is connected in a feedback path of said operational amplifier,
   g) repeating process of applying said input pulse, measuring said output response and adjusting said feedback capacitance until a difference between said peak voltage and said voltage taken at said later time are within a minimum resolution of said comparison.

8. The method of claim 7 wherein, measuring said peak voltage is done at a time close to the transition of said output response in order to detect said peak voltage resulting from an under damped condition of said operational amplifier.

9. The method of claim 7 wherein, measuring said output response for said second time is delayed from said peak measurement to allow under damped distortions to be minimized.

10. The method of claim 7 wherein, comparison measured peak voltage with measured voltage at said later time is done with a quantizer circuit which produces a digital signal based on which two compared voltages are larger.

11. The method of claim 7 wherein, setting said control logic selects a plurality of switches that connect a plurality of capacitors in parallel to adjust said feedback reactance of said operational amplifier.

12. An amplifier compensated for frequency response, comprising:
   an operational amplifier comprising a variable feedback impedance having a real part and a variable reactive part;
   a calibration circuit to adjust the variable reactive part of said variable feedback impedance comprising:
      a peak detector responsive to said operational amplifier;
      a sample and hold circuit responsive to said operational amplifier;
      a quantizer responsive to said peak detector and said sample and hold circuit; and
      a control circuit responsive to said quantizer to adjust said variable reactive part of said variable feedback impedance.

13. An amplifier according to claim 12, wherein said variable reactive part of said variable feedback impedance comprises a plurality of selectable capacitances, wherein said control circuit selects a combination of at least one of said plurality of selectable capacitances.

14. An amplifier according to claim 12, wherein said operational amplifier comprises:
   a buffer amplifier; and
   an output amplifier coupled to an output of said buffer amplifier, said output amplifier comprising said variable feedback impedance.

15. An amplifier compensated for frequency response, comprising:
   operational amplifier means for amplifying an input signal comprising a variable feedback impedance means having a real part and a variable reactive part;
   calibration means for adjusting the variable reactive part of said variable feedback impedance means, wherein said calibration means comprises:
      peak detecting means for measuring an output of said operational amplifier means in response to the input pulse at a first time;
      sample and hold means for measuring the output of said operational amplifier means at a second time;
      quantizer means for quantizing an output of said peak detector means and an output said sample and hold means; and
      control means for adjusting the variable reactive part of said variable feedback impedance means in response to said quantizer.

16. An amplifier according to claim 15, wherein said variable reactive part of said variable feedback impedance means comprises a plurality of selectable capacitance means, wherein said control means selects a combination of at least one of said plurality of selectable capacitance means.

17. An amplifier according to claim 16, wherein said operational amplifier means comprises:
   buffer amplifier means for amplifying the input signal; and
   output amplifier means for amplifying an output of said buffer amplifier means, said output amplifier comprising said variable feedback impedance means.

18. An amplifier according to claim 15, wherein said calibration means controls the reactive part of said feedback impedance means to optimize stability of said operational amplifier means.

19. A method of calibrating an operational amplifier for optimum phase margin, comprising the steps of:
   (a) applying an input pulse to the operational amplifier;
   (b) measuring a peak output of the operational amplifier in response to the input pulse at a first time;
   (c) measuring an output of the operational amplifier in response to the input pulse at a second time;
   (h) quantizing results of step(b) and step(c)
   (i) adjusting a variable reactive part of the variable feedback impedance of the operational amplifier in accordance with a result of step (d).

20. A method according to claim 19, wherein steps (b) through (e) are repeated until the difference between the peak measured in step (b) and the output measured in step (c) is less than a predetermined threshold.

21. A method according to claim 19, wherein in step (e) a capacitive component of the variable reactance is increased if the magnitude of the peak measured in step (b) is greater than the magnitude the output measured in step (c).

22. A method according to claim 19, wherein in step (e) the capacitive component of the variable reactance is decreased if the magnitude of the peak measured in step (b) is less than the magnitude the output measured in step (c).

23. A calibration circuit for an operational amplifier to adjust a variable reactive part of a variable impedance thereof to optimize phase margin. said calibration circuit comprising:
   a peak detector responsive to the operational amplifier;
   a sample and hold circuit responsive to the operational amplifier;
   a quantizer responsive to said peak detector and said sample and hold circuit; and
   a control circuit responsive to said quantizer to adjust the variable reactive part of the variable feedback impedance.

24. A calibration circuit according to claim 23, wherein the variable reactive part of the variable feedback impedance comprises a plurality of selectable capacitances, wherein said control circuit selects a combination of at least one of said plurality of selectable capacitances.

25. A calibration circuit for an operational amplifier to adjust a variable reactive part of a variable impedance thereof to optimize phase margin, said calibration circuit comprising:
   peak detecting means for measuring an output of the operational amplifier means in response to the input pulse at a first time;
   sample and hold means for measuring the output of said operational amplifier means at a second time;
   quantizer means for quantizing an output of said peak detector means and an output of said sample and hold means; and
   control means for adjusting the variable reactive part of said variable feedback impedance means in response to said quantizer.

26. An amplifier compensated for frequency response, comprising:
   an operational amplifier comprising a variable feedback impedance having a real part and a variable reactive part;
   a calibration circuit to adjust the variable reactive part of said variable feedback impedance to optimize phase margin of said operational amplifier in response to detecting an input pulse to said operational amplifier,
   wherein said variable reactive part of said variable feedback impedance comprises a plurality of selectable capacitances, wherein said control circuit selects a combination of at least one of said plurality of selectable capacitances.

27. An amplifier compensated for frequency response, comprising:
   operational amplifier means for amplifying an input signal comprising a variable feedback impedance means having a real part and a variable reactive part;
   calibration means for adjusting the variable reactive part of said variable feedback impedance means for optimizing phase margin of said operational amplifier means in response to detecting an input pulse to said operational amplifier means,
   wherein said variable reactive part of said variable feedback impedance means comprises a plurality of selectable capacitance means, wherein said control means selects a combination of at least one of said plurality of selectable capacitance means.

28. An amplifier compensated for frequency response, comprising:
   an operational amplifier comprising a variable feedback impedance; and
   a calibration circuit to adjust said variable feedback impedance comprising:
   a peak detector responsive to said operational amplifier;
   a sample and hold circuit responsive to said operational amplifier;
   a quantizer responsive to said peak detector and said sample and hold circuit; and
   a control circuit responsive to said quantizer to adjust said variable feedback impedance.

29. An amplifier compensated for frequency response, comprising:
   operational amplifier means for amplifying an input signal comprising a variable feedback impedance means; and
   calibration means for adjusting said variable feedback impedance means, wherein said calibration means comprises:
   peak detecting means for measuring an output of said operational amplifier means in response to the input pulse at a first time;
   sample and hold means for measuring the output of said operational amplifier means at a second time;
   quantizer means for quantizing an output of said peak detector means and an output said sample and hold means; and
   control means for adjusting said variable feedback impedance means in response to said quantizer.

30. A method of calibrating an operational amplifier for optimum phase margin, comprising the steps of:
   (a) applying an input pulse to the operational amplifier;
   (b) measuring a peak output of the operational amplifier in response to the input pulse at a first time;
   (c) measuring an output of the operational amplifier in response to the input pulse at a second time;
   (j) quantizing results of step(d) and step(c)
   (k) adjusting a variable feedback impedance of the operational amplifier in accordance with a result of step (d).

31. A calibration circuit for an operational amplifier to adjust a variable impedance thereof to optimize phase margin, said calibration circuit comprising:
   a peak detector responsive to the operational amplifier;
   a sample and hold circuit responsive to the operational amplifier;
   a quantizer responsive to said peak detector and said sample and hold circuit; and
   a control circuit responsive to said quantizer to adjust the variable feedback impedance.

32. A calibration circuit for an operational amplifier to adjust a variable impedance thereof to optimize phase margin, said calibration circuit comprising:
   peak detecting means for measuring an output of the operational amplifier means in response to the input pulse at a first time;

sample and hold means for measuring the output of said operational amplifier means at a second time;

quantizer means for quantizing an output of said peak detector means and an output of said sample and hold means; and control means for adjusting said variable feedback impedance means in response to said quantizer.

33. An amplifier compensated for frequency responses, comprising:

an operational amplifier comprising a variable feedback impedance;

a calibration circuit to adjust said variable feedback impedance to optimize phase margin of said operational amplifier in response to detecting an input pulse to said operational amplifier, wherein said variable feedback impedance comprises a plurality of selectable capacitances, wherein said control circuit selects a combination of at least one of said plurality of selectable capacitances.

34. An amplifier compensated for frequency response, comprising:

operational amplifier means for amplifying an input signal comprising a variable feedback impedance means;

calibration means for adjusting said variable feedback impedance means for optimizing phase margin of said operational amplifier means in response to detecting an input pulse to said operational amplifier means, wherein said variable feedback impedance means comprises a plurality of selectable capacitance means, wherein said control means selects a combination of at least one of said plurality of selectable capacitance means.

* * * * *